United States Patent
Li et al.

(10) Patent No.: US 8,412,138 B2
(45) Date of Patent: Apr. 2, 2013

(54) DIGITAL SIGNAL PROCESSING SYSTEM AND MULTI-SIGNAL CONNECTOR THEREOF

(75) Inventors: Chia-Hsien Li, Taipei Hsien (TW); Kuo-Kun Lin, Taipei Hsien (TW); Chu-Chia Tsai, Taipei Hsien (TW); Te-Lung Wu, Taipei Hsien (TW)

(73) Assignee: Wistron Corp., Taipei Hsien (TW)

( * ) Notice: Subject to any disclaimer, the term of this patent is extended or adjusted under 35 U.S.C. 154(b) by 1374 days.

(21) Appl. No.: 11/882,020

(22) Filed: Jul. 30, 2007

(65) Prior Publication Data

US 2008/0146179 A1 Jun. 19, 2008

(30) Foreign Application Priority Data

Dec. 13, 2006 (TW) ................................ 95146746 A

(51) Int. Cl.
*H04B 1/16* (2006.01)
(52) U.S. Cl. ...................... 455/205; 455/3.02; 455/558
(58) Field of Classification Search .................. 455/205, 455/3.02, 558
See application file for complete search history.

(56) References Cited

U.S. PATENT DOCUMENTS

| 5,946,194 A | 8/1999 | Dudas et al. |
| 6,139,364 A | 10/2000 | Beutler et al. |
| 2007/0149111 A1* | 6/2007 | Nguyen et al. ............... 455/3.02 |

FOREIGN PATENT DOCUMENTS

| JP | 2002135808 A | 5/2002 |
| TW | 344176 | 11/1998 |
| TW | 200623695 | 7/2006 |
| WO | WO2005011956 | 12/2005 |

* cited by examiner

*Primary Examiner* — Christian Hannon
(74) *Attorney, Agent, or Firm* — Muncy, Geissler, Olds & Lowe, PLLC

(57) ABSTRACT

A multi-signal connector includes a first tuner, a first demodulator, a first radio frequency signal pin, a first ground signal pin and digital signal pins, and the first radio frequency signal pin transmits a first radio frequency signal. The first tuner receives the first radio frequency signal and outputs a first digital signal. The first demodulator receives the first digital signal and outputs an MPEG signal via the digital signal pins. The ground signal pin is disposed between the first radio frequency signal pin and the digital signal pins for reducing the interference and noise between the first radio frequency signal and the MPEG signal. A digital signal processing system is also disclosed.

16 Claims, 8 Drawing Sheets

DIGITAL SIGNAL PROCESSING SYSTEM AND MULTI-SIGNAL CONNECTOR THEREOF

RELATED APPLICATIONS

This application claims priority to Taiwan Application Serial Number 95146746, filed Dec. 13, 2006, which is herein incorporated by reference.

BACKGROUND

1. Field of Invention

The present invention relates to a digital signal processing system, such as an image display system, and a multi-signal connector thereof. More particularly, the present invention relates to a digital signal processing system and a multi-signal connector thereof to integrate radio frequency signals and digital signals.

2. Description of Related Art

Mobile communication technology has recently been developed, so it is more and more common for users to watch video on portable electronic products. Therefore, the development of wireless communication technology has already become very important.

For wireless communication technology, a signal receiver receives external wireless signals. The wireless signals are then converted into data with a wireless module, and then the data is transformed by different devices into different digital signals for further processing. In order to prevent interference between the wireless signals and the digital signals, different modules are often designed to process the wireless signals and the digital signals, respectively. However, the wireless signals and the digital signals still cannot be processed in a single module; that is, the wireless signals and the digital signals cannot be integrated in a single module. Further, the foregoing modules, used to process the wireless signals and the digital signals, are usually manufactured inside a console when producing this kind of wireless communication product, and then the console is sold as a whole product. However, if the functions of the wireless communication product are going to be expanded, another circuit has to be designed for the whole console; that is, expanding the functions of the wireless communication product is not flexible, and the design for the circuit is therefore not convenient.

For the foregoing reasons, there is a need for a wireless module capable of integrating the wireless signals and the digital signals and being manufactured as a single module that is independent from the console, so as to expand the functions of the module conveniently.

SUMMARY

It is therefore an aspect of the present invention to provide a digital signal processing system, such as an image display system, and a multi-signal connector thereof, so as to integrate wireless signals and digital signals in the multi-signal connector and display the digital signals on a display with the digital signal processing system.

In accordance with one embodiment of the present invention, a multi-signal connector is provided. The multi-signal connector includes a circuit board, a first radio frequency signal pin, a first tuner, a first demodulator, digital signal pins and a first ground signal pin. The first radio frequency signal pin is disposed on the circuit board for transmitting a first radio frequency signal. The first tuner is disposed on the circuit board for receiving the first radio frequency signal via the first radio frequency signal pin and for converting the first radio frequency signal into a first digital signal. The first demodulator is disposed on the circuit board for receiving the first digital signal from the first tuner and converting the first digital signal into a moving pictures experts group (MPEG) signal compatible with an MPEG-2 or MPEG-4 standard. The digital signal pins are disposed on the circuit board for transmitting the MPEG signal. The first radio frequency signal is disposed on the circuit board and between the first radio frequency signal pin and the digital signal pins for reducing interference and noise between the first radio frequency signal and the MPEG signal.

In accordance with another embodiment of the present invention, a digital signal processing system is provided. The digital signal processing system receives radio frequency signals and converts the radio frequency signals into digital signals, such as a digital image signal, a digital coordinates signal, and etc., displayed on a display. The digital signal processing system includes a signal receiver and a multi-signal connector, in which the signal receiver receives a first radio frequency signal and the multi-signal connector is electrically connected to the signal receiver. The multi-signal connector includes a circuit board, signal pins, a first tuner and a first demodulator, in which the signal pins are disposed on the circuit board and further include a first radio frequency signal pin, a first ground signal pin and digital signal pins, and the first radio frequency signal pin transmits the first radio frequency signal. The first tuner is disposed on the circuit board for receiving the first radio frequency signal via the first radio frequency signal pin and converting the first radio frequency signal into a first digital signal. The first demodulator is disposed on the circuit board for receiving the first digital signal from the first tuner and converting the first digital signal into a moving pictures experts group (MPEG) signal compatible with an MPEG-2 or MPEG-4 standard transmitted via the digital signal pins to the signal receiver to be processed. The first ground signal pin is disposed between the first radio frequency signal pin and the digital signal pins for reducing interference and noise between the first radio frequency signal and the MPEG signal.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the preferred embodiment, with reference made to the accompanying drawings as follows.

DESCRIPTION OF THE PREFERRED EMBODIMENTS

Detailed illustrative embodiments of the present invention are disclosed herein. However, specific details disclosed herein are merely representative for purposes of describing exemplary embodiments of the present invention. This invention may, however, be embodied in many alternate forms and should not be construed as limited to the embodiments set forth herein.

Figure 1:
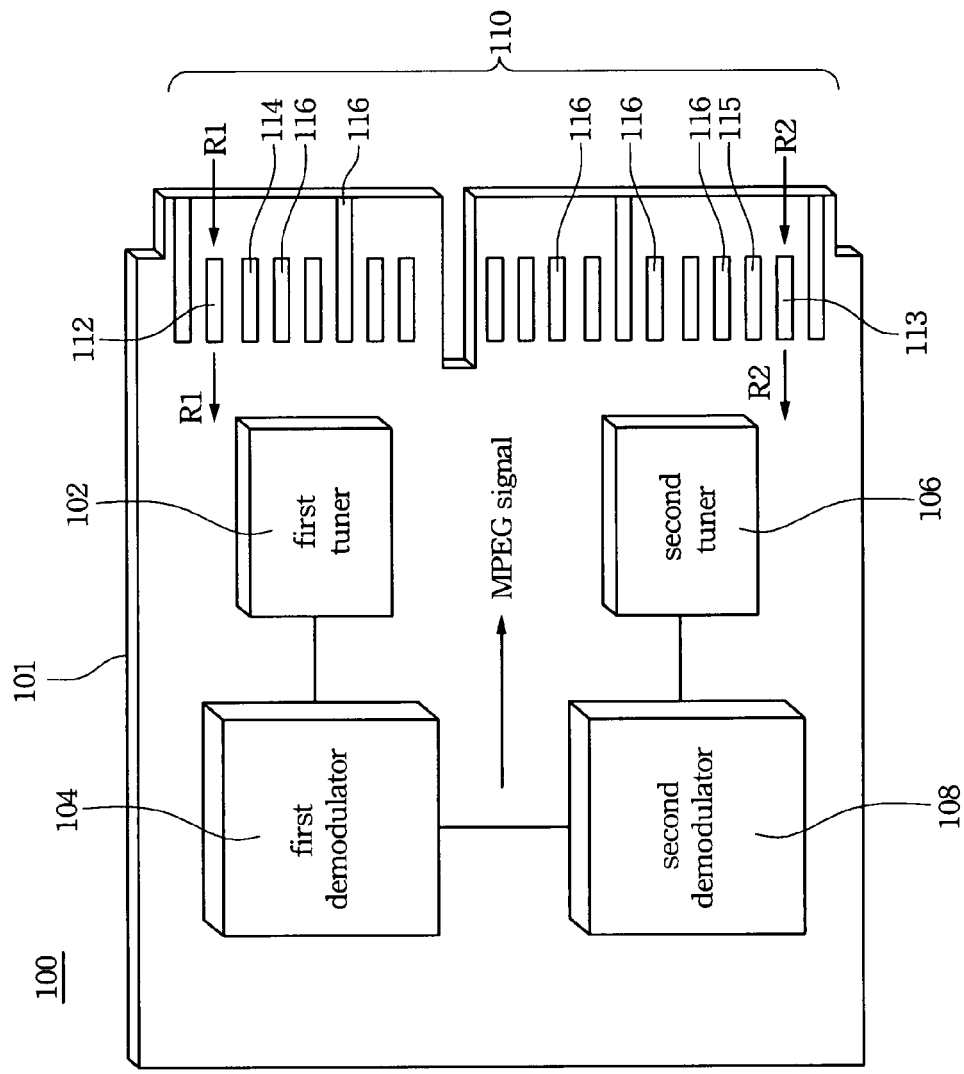
FIG. 1 shows a multi-signal connector according to one embodiment of the present invention.

FIG. 1 shows a multi-signal connector according to one embodiment of the present invention. The multi-signal connector 100 includes a circuit board 101, a first tuner 102, a first demodulator 104 and signal pins 110, in which the first tuner 102, the first demodulator 104 and the signal pins 110 are all disposed on the circuit board 101. The signal pins 110 further includes a first radio frequency signal pin 112, a first ground signal pin 114 and digital signal pins 116, in which the first radio frequency signal pin 112 transmits a first radio frequency signal R1. The first tuner 102 receives the first radio frequency signal R1 via the first radio frequency signal pin 112 and converts the first radio frequency signal R1 into a first digital signal. The first demodulator 104 receives the first digital signal outputted from the first tuner 102 and converts the first digital signal into a moving pictures experts group (MPEG) signal compatible with an MPEG-2 or MPEG-4 standard. The digital signal pins 116 also transmit the MPEG signal or other signals outputted from the first demodulator 104 to a device coupled to the multi-signal connector 100. The first ground signal pin 114 is disposed between the first radio frequency signal pin 112 and the digital signal pins 116 for reducing the interference and noise between the first radio frequency signal R1 and the digital signal or the MPEG signal.

Furthermore, the multi-signal connector 100 can further include a second tuner 106, a second demodulator 108, a second radio frequency signal pin 113 and a second ground signal pin 115, in which the second radio frequency signal pin 113 transmits a second radio frequency signal R2. Similarly, the second tuner 106 receives the second radio frequency signal R2 via the second radio frequency signal pin 113 and converts the second radio frequency signal R2 into a second digital signal. The second demodulator 108 receives the second digital signal outputted from the second tuner 106 and converts the second digital signal into the MPEG signal. Besides, the second ground signal pin 115 is disposed between the second radio frequency signal pin 113 and the digital signal pins 116 for reducing the interference and noise between the second radio frequency signal R2 and the digital signal or the MPEG signal. The first radio frequency signal pin 112 and the second radio frequency signal pin 113 can be metal pins or microwave coaxial connectors.

Figure 2:
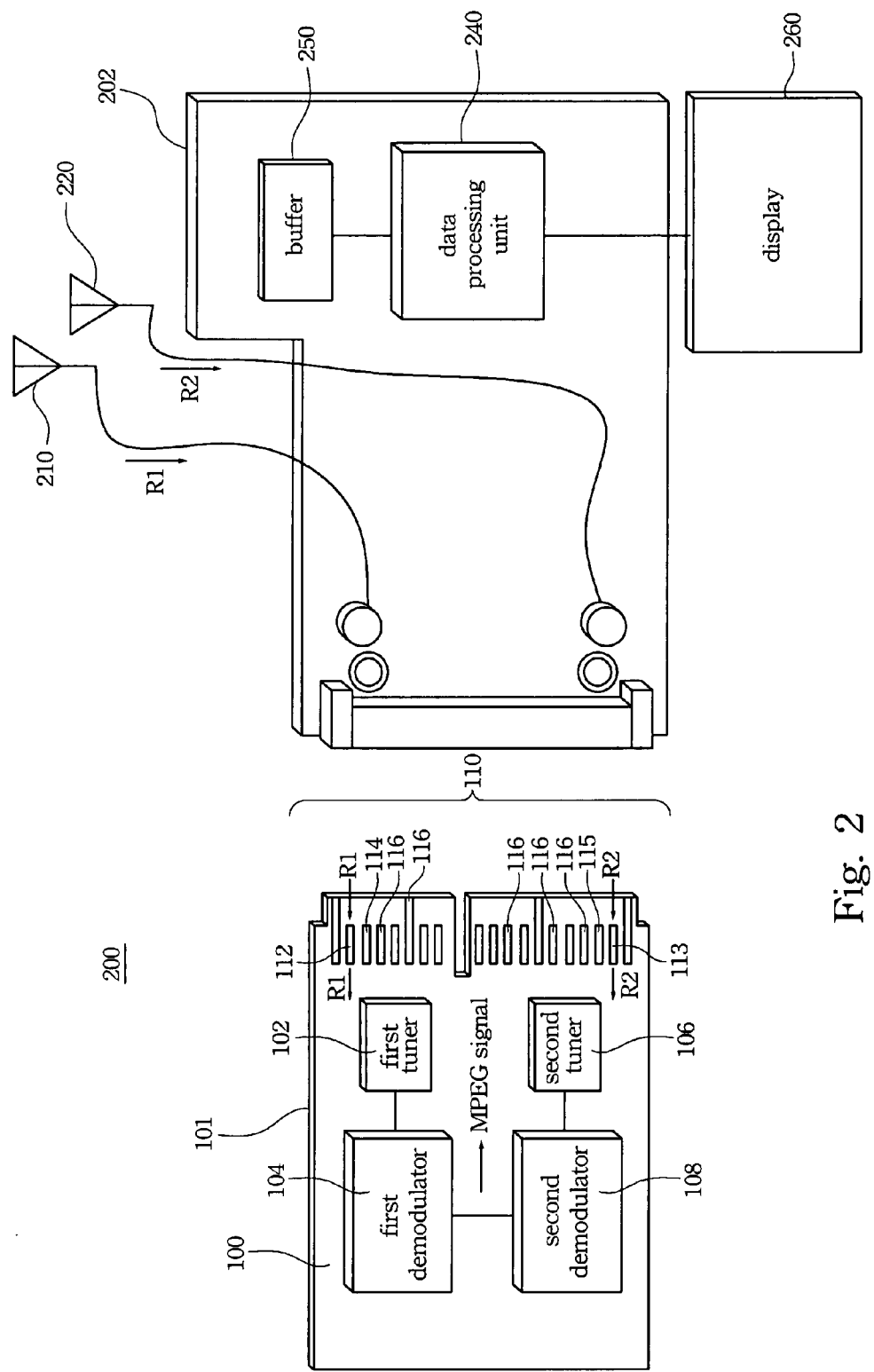
FIG. 2 shows a digital signal processing system according to one embodiment of the present invention.

FIG. 2 shows a digital signal processing system according to one embodiment of the present invention. The digital signal processing system 200 includes a signal receiver 202 and the multi-signal connector 100 as shown in FIG. 1, in which the multi-signal connector 100 is electrically connected to the signal receiver 202; that is, the multi-signal connector 100 is associated with the signal receiver 202 to form the digital signal processing system 200, and the figure shown is the condition that the multi-signal connector 100 has not been associated with the signal receiver 202. Besides, the digital signal processing system 200 receives the radio frequency signals with a signal transceiver 210, such as an antenna, and converts the radio frequency signals into the digital signals displayed on a display 260.

The following embodiment describes the condition of the multi-signal connector 100 when the multi-signal connector 100 is associated with the signal receiver 202. The signal receiver 202 receives the first radio frequency signal R1 with the signal transceiver 210, such as an antenna. The first tuner 102 of the multi-signal connector 100 receives the first radio frequency signal R1 via the first radio frequency signal pin 112 and converts the first radio frequency signal R1 into the first digital signal. The first demodulator 104 receives the first digital signal outputted from the first tuner 102 and converts the first digital signal into the MPEG signal compatible with the MPEG-2 or MPEG-4 standard, which is transmitted via the digital signal pins 116 to the signal receiver 202 to be processed. Besides, the first ground signal pin 114 is disposed between the first radio frequency signal pin 112 and the digital signal pins 116 for reducing the interference and noise between the first radio frequency signal R1 and the MPEG signal.

Moreover, the signal receiver 202 includes a data processing unit 240 and a buffer 250. The data processing unit 240 converts the MPEG signal transmitted via the digital signal pins 116 into a video signal displayed on the display 260. The buffer 250 stores the MPEG signal which the data processing unit 240 has not processed yet. The data processing unit 240 can be a micro-processor or a digital signal processor.

The signal receiver 202 can further receive the second radio frequency signal R2 with another signal transceiver 220. Similarly, the second tuner 106 of the multi-signal connector 100 receives the second radio frequency signal R2 via the second radio frequency signal pin 113 and converts the second radio frequency signal R2 into the second digital signal. The second demodulator 108 receives the second digital signal outputted from the second tuner 106 and converts the second digital signal into the MPEG signal compatible with the MPEG-2 or MPEG-4 standard, which is similarly transmitted via the digital signal pins 116 to the signal receiver 202 to be processed. Besides, the foregoing first radio frequency signal pin 112 and the second radio frequency signal pin 113 can be the metal pins or the microwave coaxial connector.

For the foregoing embodiment, in order to reduce the interference and noise between the radio frequency signals and the MPEG signal, the radio frequency signal pins can be set at the positions closer to both end sides, and then the ground signal pin is used to separate the radio frequency signal pins and the digital signal pins. Therefore, it is helpful to reduce the interference and noise between the radio frequency signals and the MPEG signal in the multi-signal connector.

Figure 3:
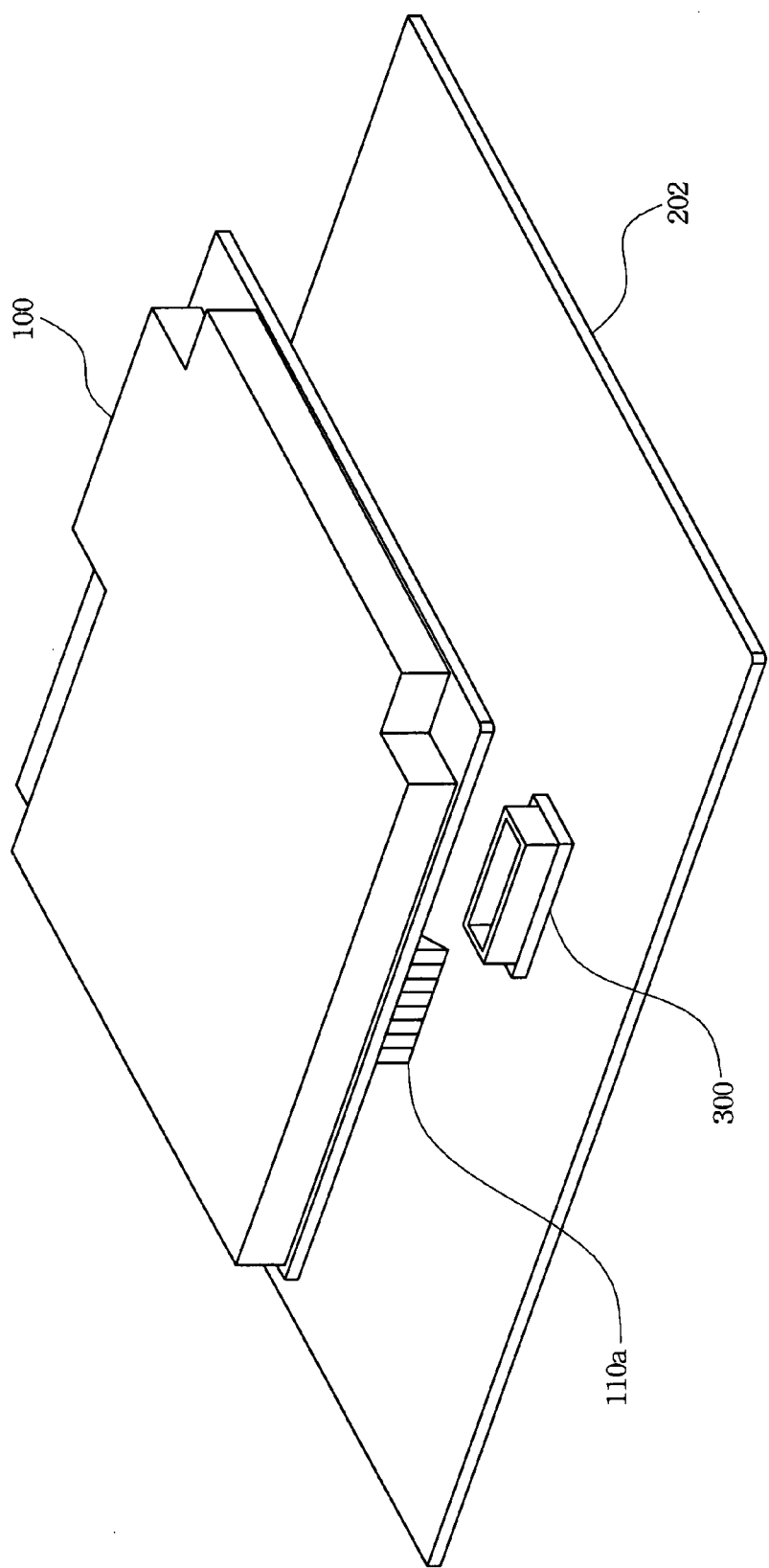
FIG. 3 shows the signal receiver connected to the multi-signal connector according to the first embodiment of the present invention.

FIG. 3 shows the signal receiver connected to the multi-signal connector according to the first embodiment of the present invention. In the present embodiment, the first surface of the signal receiver 202 has a slot 300 and the opening aspect of the slot is perpendicular to the first surface, and the signal pins 110a of the multi-signal connector 100 are the metal pins disposed on the second surface of the multi-signal connector 100 and perpendicular to the second surface, in which the metal pins are inserted into the slot 300 to make the multi-signal connector 100 electrically connected to the signal receiver 202.

Figure 4:
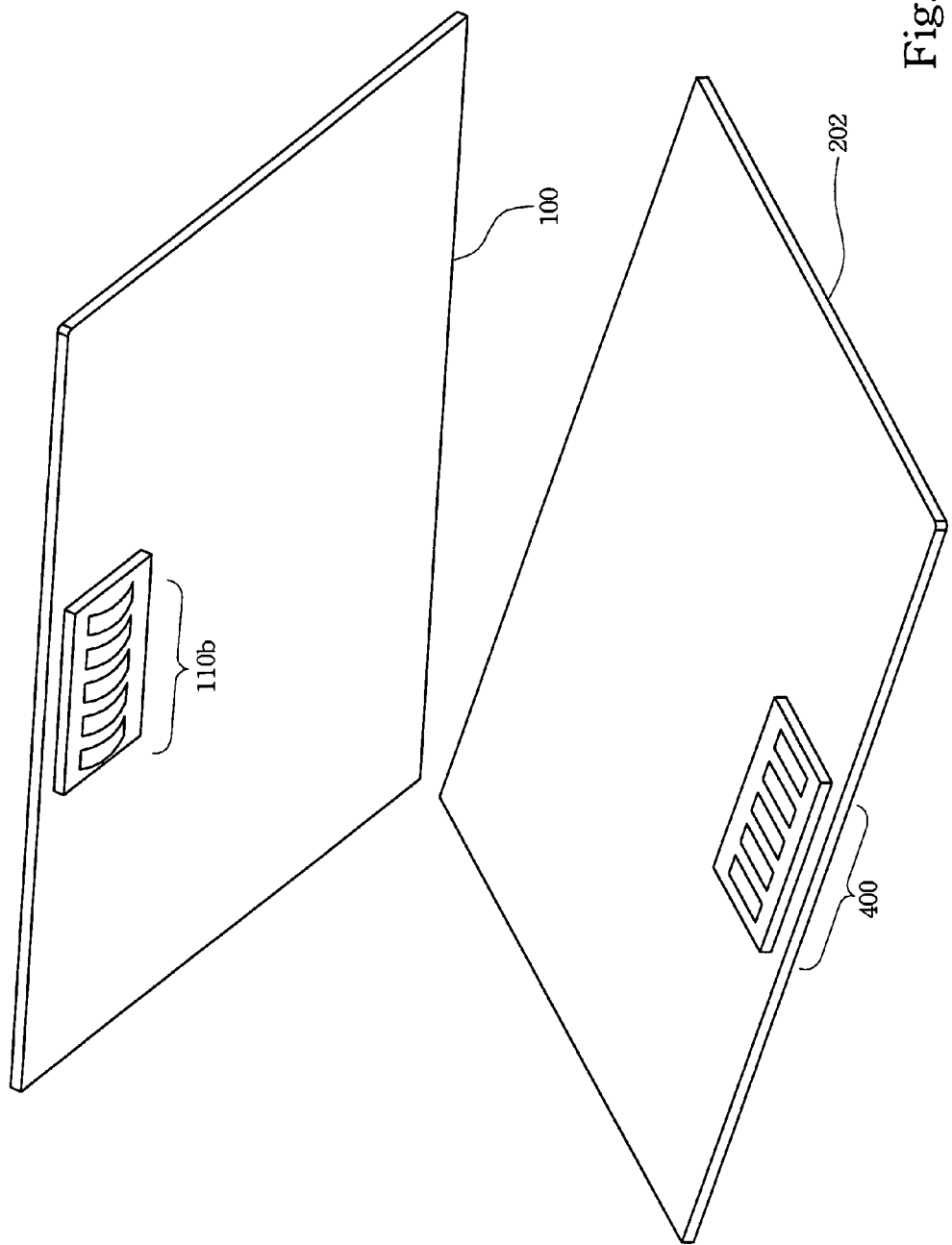
FIG. 4 shows the signal receiver connected to the multi-signal connector according to the second embodiment of the present invention.

FIG. 4 shows the signal receiver connected to the multi-signal connector according to the second embodiment of the present invention. In the present embodiment, the first surface of the signal receiver 202 has metal pads 400, and the signal pins 110b of the multi-signal connector 100 are the metal leaf springs disposed on the second surface of the multi-signal connector 100, in which the metal leaf springs couple to the metal pads 400 to make the multi-signal connector 100 electrically connected to the signal receiver 202.

Figure 5:
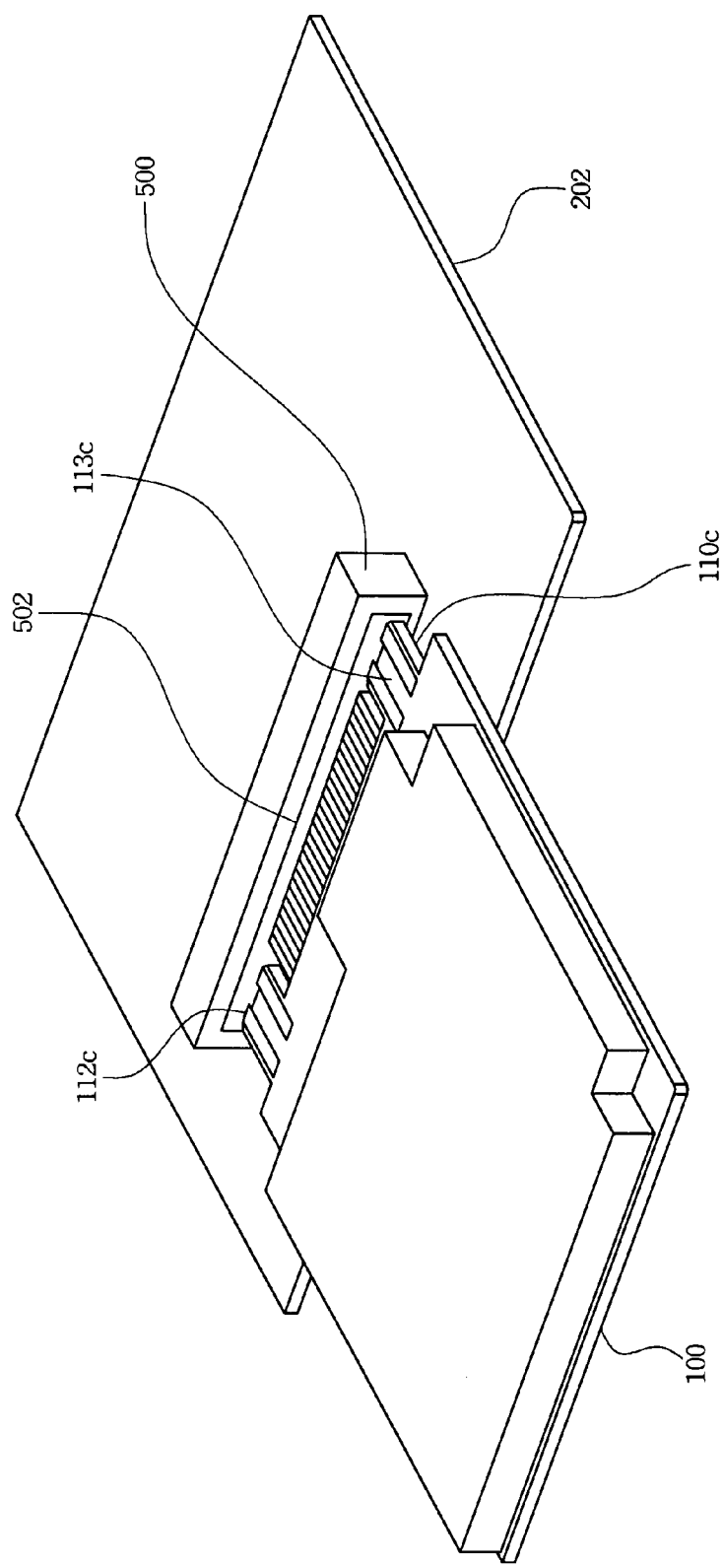
FIG. 5 shows the signal receiver connected to the multi-signal connector according to the third embodiment of the present invention.

FIG. 5 shows the signal receiver connected to the multi-signal connector according to the third embodiment of the present invention. In the present embodiment, the first surface of the signal receiver 202 has a connector socket 500 and the connector socket 500 has a slot 502, in which the opening aspect of the slot 502 is parallel with the first surface of the signal receiver 202. Besides, the signal pins 110c of the multi-signal connector 100 are the metal pins disposed on one side of the multi-signal connector 100 and are parallel with the first surface of the multi-signal connector 100, and the first radio frequency signal pin 112c and the second radio frequency signal pin 113c are respectively located at the positions closer to both end sides. The metal pins are inserted into the slot 502 of the connector socket 500 to make the multi-signal connector 100 electrically connected to the signal receiver 202.

Figure 6:
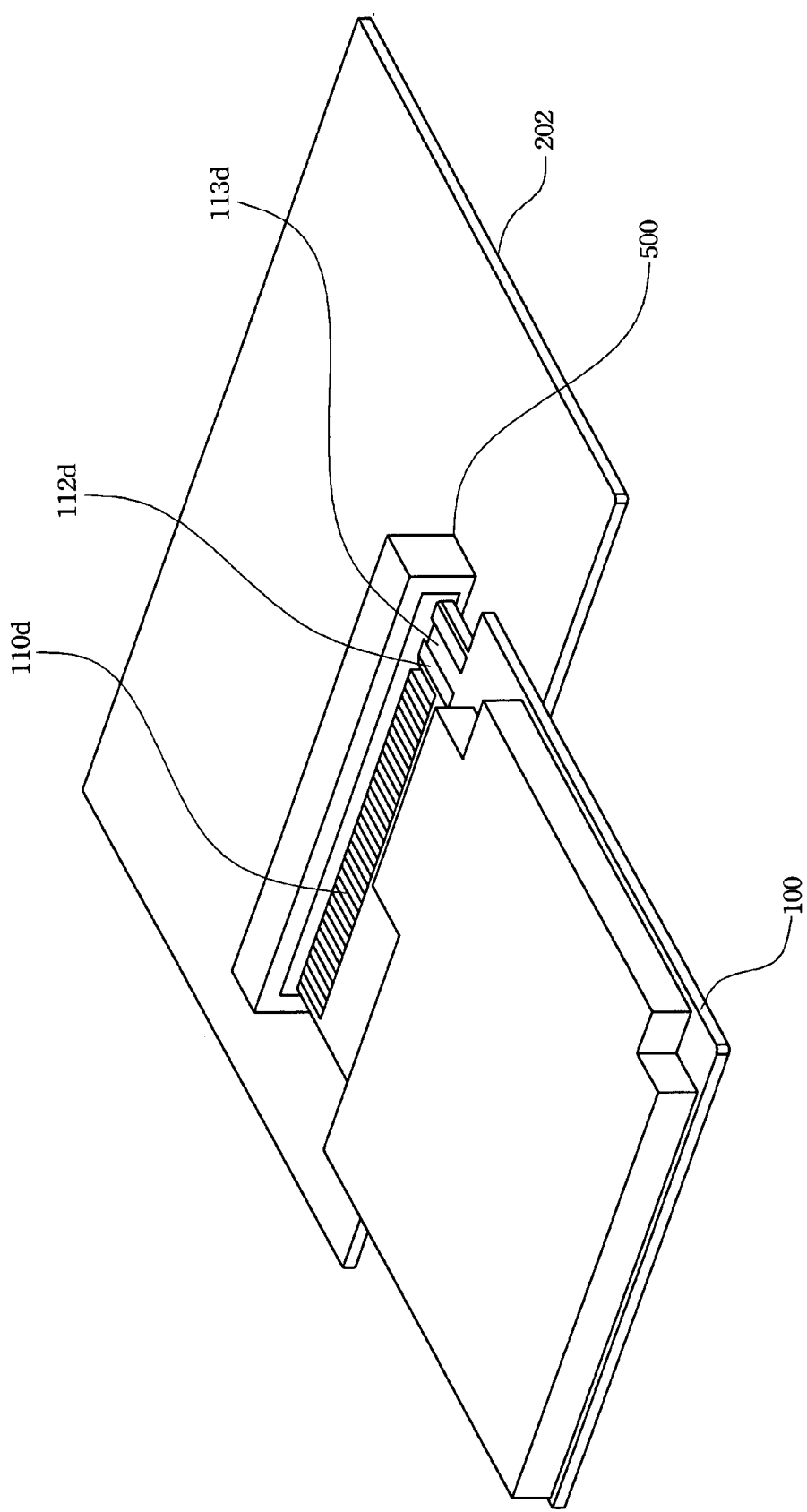
FIG. 6 shows the signal receiver connected to the multi-signal connector according to the fourth embodiment of the present invention.

FIG. 6 shows the signal receiver connected to the multi-signal connector according to the fourth embodiment of the present invention. Comparing FIG. 6 with FIG. 5, the first radio frequency signal pin 112d and the second radio frequency signal pin 113d of the signal pins 110d in FIG. 6 are designed to be located on the same side.

Figure 7:
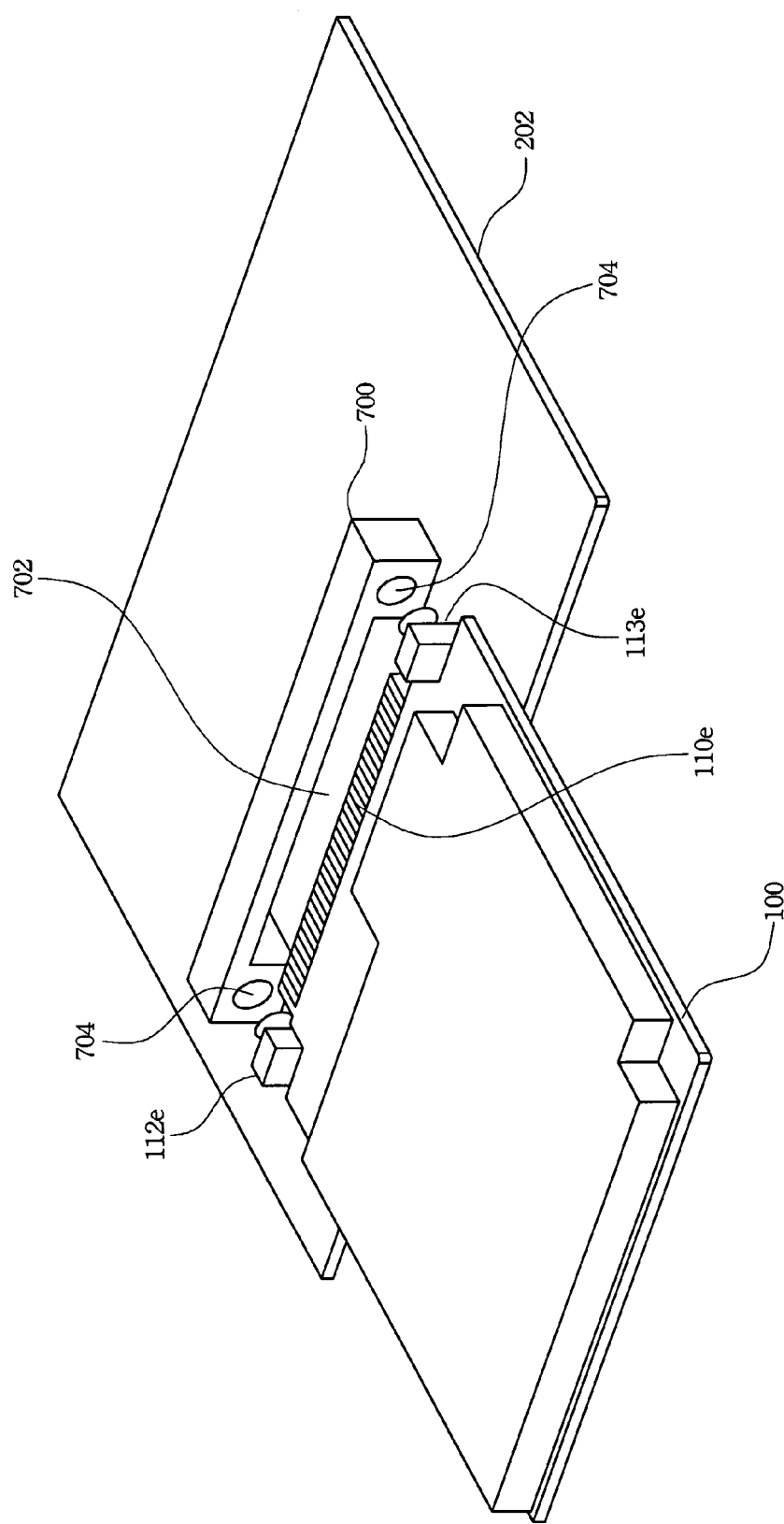
FIG. 7 shows the signal receiver connected to the multi-signal connector according to the fifth embodiment of the present invention.

FIG. 7 shows the signal receiver connected to the multi-signal connector according to the fifth embodiment of the present invention. In the present embodiment, the first surface of the signal receiver 202 has a connector socket 700 and the connector socket 700 includes a slot 702 and two microwave coaxial connector sockets 704, in which the opening aspect of the slot 702 is parallel with the first surface of the signal receiver 202 and the opening aspect of the microwave coaxial connector sockets 704 are the same as the opening aspect of the slot 702. The first radio frequency signal pin 112e and the second radio frequency signal pin 113e of the multi-signal connector 100 are the microwave coaxial connectors and the other signal pins 110e are the metal pins, in which all of the signal pins are located on one side of the multi-signal connector 100. The metal pins are inserted into the slot 702 and the microwave coaxial connectors connects to the microwave coaxial connector sockets 704 to make the multi-signal connector 100 electrically connected to the signal receiver 202.

Figure 8:
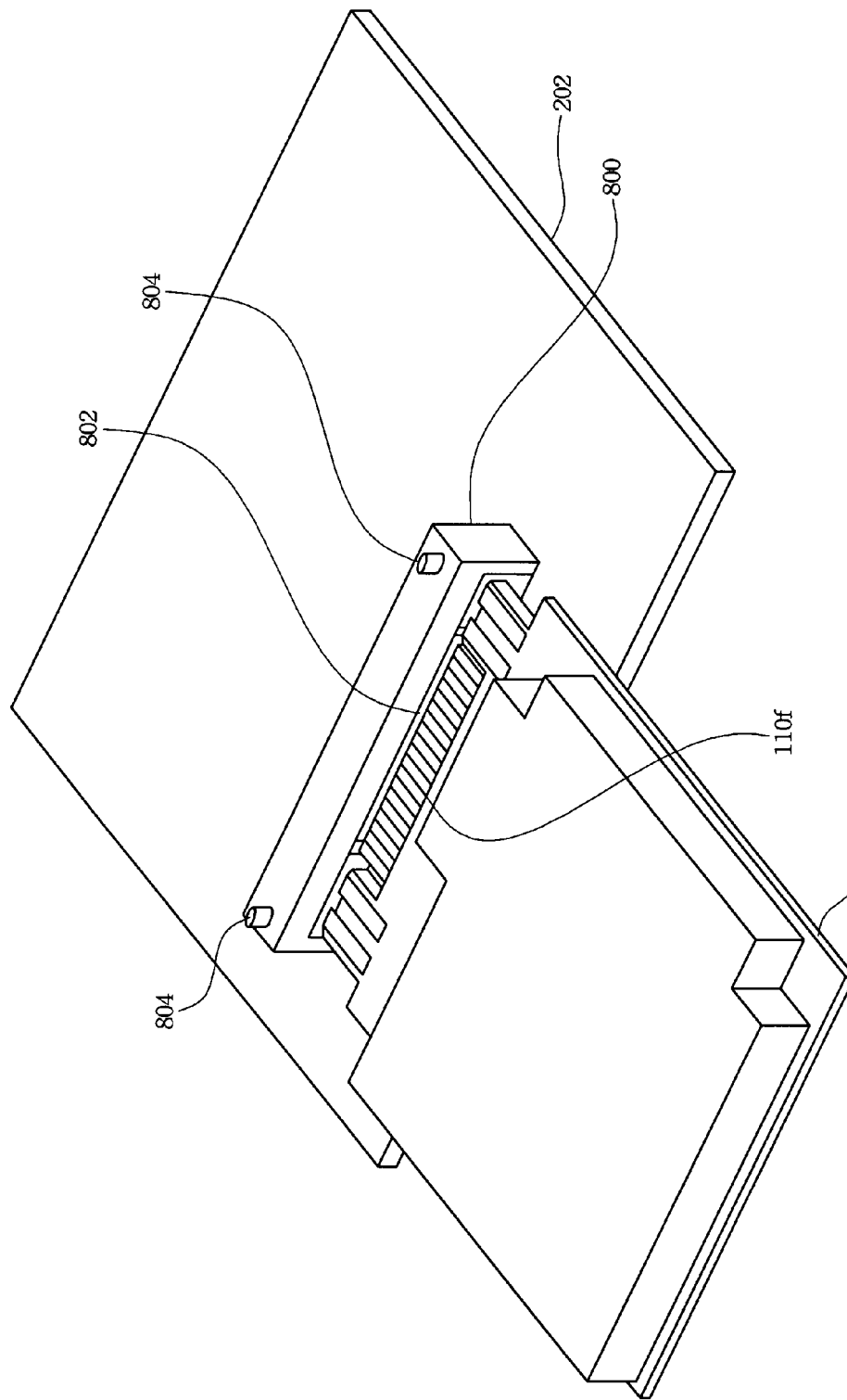
FIG. 8 shows the signal receiver connected to the multi-signal connector according to the sixth embodiment of the present invention.

FIG. 8 shows the signal receiver connected to the multi-signal connector according to the sixth embodiment of the present invention. In the present embodiment, the first surface of the signal receiver 202 has a connector socket 800 and the connector socket 800 includes a slot 802 and two connector terminal 804, in which the opening aspect of the slot 802 is parallel to the first surface of the signal receiver 202 and two connector terminals respectively connect to the radio frequency signal connectors (not shown) to receive the first and second radio frequency signals. The signal pins 110f of the multi-signal connector 100 are the metal pins disposed on one side of the multi-signal connector 100 and parallel with the first surface of the multi-signal connector 100, in which the metal pins are inserted into the slot 802 to make the multi-signal connector 100 electrically connected to the signal receiver 202.

For the foregoing embodiments, the digital signal processing system and the multi-signal connector thereof are capable of integrating the wireless signals and the digital signals in the multi-signal connector and transmitting the data with the digital signal processing system to the main system to be processed.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A multi-signal connector, comprising:
a circuit board;
a first radio frequency signal pin disposed on the circuit board for transmitting a first radio frequency signal;
a first tuner disposed on the circuit board for receiving the first radio frequency signal via the first radio frequency signal pin and converting the first radio frequency signal into a first digital signal;
a first demodulator disposed on the circuit board for receiving the first digital signal from the first tuner and converting the first digital signal into a moving pictures experts group (MPEG) signal compatible with an MPEG-2 or MPEG-4 standard;
a plurality of digital signal pins disposed on the circuit board for transmitting the MPEG signal, the first demodulator configured to transmit the MPEG signal via the digital signal pins to a signal receiver to be processed; and
a first ground signal pin disposed on the circuit board and between the first radio frequency signal pin and the digital signal pins for reducing interference and noise between the first radio frequency signal and the MPEG signal, wherein the first radio frequency signal pin, the first tuner, the first demodulator, the plurality of digital signal pins, and the first ground signal pin are integrated on the circuit board.

2. The multi-signal connector as claimed in claim 1, further comprising:
a second radio frequency signal pin disposed on the circuit board for transmitting a second radio frequency signal; and
a second ground signal pin disposed on the circuit board and between the second radio frequency signal pin and the digital signal pins for reducing interference and noise between the second radio frequency signal and the MPEG signal.

3. The multi-signal connector as claimed in claim 2, further comprising:
a second tuner disposed on the circuit board for receiving the second radio frequency signal via the second radio frequency signal pin and converting the second radio frequency signal into a second digital signal; and
a second demodulator disposed on the circuit board for receiving the second digital signal from the second tuner and converting the second digital signal into the MPEG signal.

4. The multi-signal connector as claimed in claim 2, wherein the first radio frequency signal pin and the second radio frequency signal pin are metal pins or microwave coaxial connectors.

5. A digital signal processing system for receiving radio frequency signals and converting the radio frequency signals into digital signals displayed on a display, the digital signal processing system comprising:

a signal receiver for receiving a first radio frequency signal; and a multi-signal connector electrically connected to the signal receiver, the multi-signal connector comprising:

a circuit board;

a plurality of signal pins disposed on the circuit board, the signal pins comprising a first radio frequency signal pin, a first ground signal pin and a plurality of digital signal pins, wherein the first radio frequency signal pin is capable of transmitting the first radio frequency signal;

a first tuner disposed on the circuit board for receiving the first radio frequency signal via the first radio frequency signal pin and converting the first radio frequency signal into a first digital signal; and a first demodulator disposed on the circuit board for receiving the first digital signal from the first tuner and converting the first digital signal into a moving pictures experts group (MPEG) signal compatible with an MPEG-2 or MPEG-4 standard, the first demodulator configured to transmit the MPEG signal via the digital signal pins to the signal receiver to be processed;

wherein the first ground signal pin is disposed between the first radio frequency signal pin and the digital signal pins for reducing interference and noise between the first radio frequency signal and the MPEG signal, wherein the first radio frequency signal pin, the first tuner, first demodulator, the plurality of digital signal pins, and the first ground signal pin are integrated on the circuit board.

6. The digital signal processing system as claimed in claim 5, wherein the signal receiver further comprises:

a data processing unit for converting the MPEG signal into a video signal to be displayed on a display; and a buffer for storing the MPEG signal which the data processing unit has not processed yet.

7. The digital signal processing system as claimed in claim 6, wherein the data processing unit is a micro-processor or a digital signal processor.

8. The digital signal processing system as claimed in claim 5, wherein the signal receiver further receives a second radio frequency signal.

9. The digital signal processing system as claimed in claim 8, wherein the signal pins further comprises:

a second radio frequency signal pin for transmitting a second radio frequency signal; and a second ground signal pin disposed between the second radio frequency signal pin and the digital signal pins for reducing interference and noise between the second radio frequency signal and the MPEG signal.

10. The digital signal processing system as claimed in claim 9, wherein the multi-signal connector further comprises:

a second tuner disposed on the circuit board for receiving the second radio frequency signal via the second radio frequency signal pin and converting the second radio frequency signal into a second digital signal; and a second demodulator disposed on the circuit board for receiving the second digital signal from the second tuner and converting the second digital signal into the MPEG signal.

11. The digital signal processing system as claimed in claim 9, wherein the first radio frequency signal pin and the second radio frequency signal pin are metal pins or microwave coaxial connectors.

12. The digital signal processing system as claimed in claim 5, wherein a first surface of the signal receiver has a slot and an opening aspect of the slot is perpendicular to the first surface, and the signal pins of the multi-signal connector are metal pins disposed on a second surface of the multi-signal connector and perpendicular to the second surface, wherein the metal pins are inserted into the slot to make the multi-signal connector electrically connected to the signal receiver.

13. The digital signal processing system as claimed in claim 5, wherein a first surface of the signal receiver has a plurality of metal pads, and the signal pins of the multi-signal connector are metal leaf springs disposed on a second surface of the multi-signal connector, wherein the metal leaf springs connected to the metal pads to make the multi-signal connector electrically connected to the signal receiver.

14. The digital signal processing system as claimed in claim 5, wherein a first surface of the signal receiver has a connector socket and an opening aspect of a slot of the connector socket is parallel to the first surface, and the signal pins of the multi-signal connector are metal pins disposed on one side of the multi-signal connector and are parallel to a first surface of the multi-signal connector, wherein the metal pins are inserted into the slot of the connector socket to make the multi-signal connector electrically connected to the signal receiver.

15. The digital signal processing system as claimed in claim 5, wherein a first surface of the signal receiver has a connector socket, and the first radio frequency signal pin of the multi-signal connector is a microwave coaxial connector and the digital signal pins of the multi-signal connector are metal pins, and the first radio frequency signal pin and the digital signal pins are all disposed on one side of the multi-signal connector, wherein the connector socket of the signal receiver comprises:

a slot, an opening aspect of the slot being parallel to the first surface of the signal receiver; and a microwave coaxial connector socket, an opening aspect of the microwave coaxial connector socket being the same as the opening aspect of the slot;

wherein the metal pins are inserted into the slot and the microwave coaxial connector connects to the microwave coaxial connector socket to make the multi-signal connector electrically connected to the signal receiver.

16. The digital signal processing system as claimed in claim 5, wherein a first surface of the signal receiver has a connector socket and the connector socket comprises a slot and a connector terminal, wherein an opening aspect of the slot is parallel to the first surface and the connector terminal is used to couple to a radio frequency signal connector to receive the first radio frequency signal, and the signal pins of the multi-signal connector are metal pins disposed on one side of the multi-signal connector and parallel with a first surface of the multi-signal connector, wherein the metal pins are inserted into the slot to make the multi-signal connector electrically couple to the signal receiver.

\* \* \* \* \*